United States Patent
Hughlett et al.

(10) Patent No.: US 10,672,594 B2
(45) Date of Patent: Jun. 2, 2020

(54) SYSTEM AND METHOD FOR PLASMA HEAD THERMAL CONTROL

(71) Applicant: Ontos Equipment Systems, Inc., Chester, NH (US)

(72) Inventors: Robert Emmett Hughlett, Waterbury, VT (US); Matthew Sheldon Phillips, Chester, NH (US); Eric Frank Schulte, Santa Barbara, CA (US); Michael Dow Stead, Jeffersonville, VT (US)

(73) Assignee: ONTOS EQUIPMENT SYSTEMS, INC., Chester, NH (US)

( * ) Notice: Subject to any disclaimer, the term of this patent is extended or adjusted under 35 U.S.C. 154(b) by 16 days.

(21) Appl. No.: 15/797,017

(22) Filed: Oct. 30, 2017

(65) Prior Publication Data

US 2018/0122624 A1    May 3, 2018

Related U.S. Application Data

(60) Provisional application No. 62/415,748, filed on Nov. 1, 2016.

(51) Int. Cl.
*B32B 41/00* (2006.01)
*H01J 37/32* (2006.01)

(52) U.S. Cl.
CPC .. *H01J 37/32825* (2013.01); *H01J 37/32036* (2013.01); *H01J 2237/002* (2013.01)

(58) Field of Classification Search
CPC ........... H01J 37/32825; H01J 37/32036; H01J 2237/002
USPC .......................... 156/64, 350, 351, 378, 379
See application file for complete search history.

(56) References Cited

U.S. PATENT DOCUMENTS

| | | |
|---|---|---|
| 5,895,558 A | 4/1999 | Spence |
| 6,429,400 B1 | 8/2002 | Sawada et al. |
| 9,406,485 B1 | 8/2016 | Cheng et al. |
| 2002/0029748 A1 | 3/2002 | Kuwada et al. |
| 2005/0016457 A1 | 1/2005 | Kawasaki et al. |
| 2006/0040067 A1 | 2/2006 | Culp et al. |
| 2008/0241413 A1 | 10/2008 | Ravi et al. |
| 2008/0296268 A1 | 12/2008 | Mike et al. |
| 2009/0100752 A1 | 4/2009 | Sessa et al. |
| 2011/0174778 A1 | 7/2011 | Sawada et al. |
| 2012/0258258 A1 | 10/2012 | Nagayama et al. |

OTHER PUBLICATIONS

ISR report PCT/US17/59182, dated Jan. 26, 2018.

*Primary Examiner* — Michael N Orlando
*Assistant Examiner* — Joshel Rivera
(74) *Attorney, Agent, or Firm* — AKC Patents, LLC; Aliki K. Collins

(57) ABSTRACT

An atmospheric pressure plasma system includes an atmospheric pressure plasma source that generates a glow discharge-type plasma. The atmospheric pressure plasma source comprises a plasma head, a heating element and an active cooling element and the heating element and active cooling element control the plasma head temperature to a set-point temperature independent of variations in plasma generating power or plasma power ON/OFF status.

20 Claims, 9 Drawing Sheets

SYSTEM AND METHOD FOR PLASMA HEAD THERMAL CONTROL

CROSS REFERENCE TO RELATED CO-PENDING APPLICATIONS

This application claims the benefit of U.S. provisional application Ser. No. 62/415,748 filed on Nov. 1, 2016 and entitled SYSTEM AND METHOD FOR PLASMA HEAD THERMAL CONTROL, which is commonly assigned and the contents of which are expressly incorporated herein by reference.

FIELD OF THE INVENTION

The present invention relates to a system and method for a plasma head thermal control and in particular to thermal control of a room-ambient plasma source head.

BACKGROUND OF THE INVENTION

In wafer-to-wafer bonding processes at low temperatures, activation of the wafer surfaces is usually recommended. A plasma is usually applied to activate the wafer surfaces in preparation for wafer-to-wafer bonding at temperatures lower than 100° C. Wafer surface activation via a plasma reduces the processing temperature and increases the wafer bonding strength. The wafer bonding strength is increased due to the increased amount of Si—OH groups, removal of wafer surface-contaminants, enhancement of viscous flow of the surface layer and enhancement of the diffusivity of water and gas trapped at the interface. In particular, atmospheric pressure plasma activated bonding involves igniting a plasma without using a low pressure environment, while maintaining a low temperature.

The temperature of the plasma gas exiting the plasma source is usually around 120° C., which is hotter than desired. Furthermore, safety specifications require the temperature of the outer surface of the plasma source to be less than 60° C. Accordingly, there is a need for improved plasma sources that provide plasma head temperatures lower than 60° C.

SUMMARY OF THE INVENTION

The present invention relates to a system and a method for a plasma head thermal control and in particular to thermal control of a room-ambient plasma source head.

In general, in one aspect, the invention features an atmospheric pressure plasma system including an atmospheric pressure plasma source that generates a glow discharge-type plasma. The atmospheric pressure plasma source comprises a plasma head, a heating element and an active cooling element and the heating element and active cooling element control the plasma head temperature to a set-point temperature independent of variations in plasma generating power or plasma power ON/OFF status.

Implementations of this aspect of the invention may include one or more of the following features. The active cooling element comprises a cooling block that is placed in contact with an outer surface of the plasma head and the cooling block sets an equilibrium operating temperature for the outer surface of the plasma head. The equilibrium operating temperature for the outer surface of the plasma head is less than 60° C. The cooling block comprises a serpentine coolant flow path and a liquid cooling radiator and a pump supply a liquid coolant to the cooling block and the liquid coolant passes through the serpentine coolant flow path. The atmospheric pressure plasma source further comprises at least one temperature sensor, and a power controller for the heating element. The heating element comprises a resistive heater that is embedded in an outer surface of the plasma head and the resistive heater together with the temperature sensor provide temperature controlled thermal energy to the outer surface of the plasma head. The plasma head comprises a gas inlet, a gas passage surrounded by a dielectric liner, a radio frequency (RF) electrode and a ground electrode. The RF electrode and the ground electrode are arranged at opposite sides of a segment of the gas passage, and the glow discharge-type plasma is generated via an alternating voltage in the segment of the gas passage between the RF electrode and the ground electrode and the glow discharge-type plasma is completely contained within the plasma head. The system further includes a process zone area that supports a substrate. The plasma head further comprises a slit and the glow discharge-type plasma exits via the slit and enters the process zone area immediately above the substrate. The glow discharge-type plasma has a temperature lower than 100° C. in the process zone area immediately above the substrate. The slit is dimensioned to generate a laminar flow of the glow discharge-type plasma in the process zone area immediately above the substrate and the laminar flow of the glow discharge-type plasma excludes atmospheric air in the process zone above the substrate.

In general, in another aspect, the invention features a method of generating an atmospheric pressure plasma including providing an atmospheric pressure plasma source that generates a glow discharge-type plasma, wherein the atmospheric pressure plasma source comprises a plasma head, a heating element and an active cooling element, and then activating simultaneously the heating element and the active cooling element to control the plasma head temperature to a set-point temperature independent of variations in plasma generating power or plasma power ON/OFF status.

Among the advantages of this invention may be one or more of the following. The plasma system of this invention eliminates the plasma-ON warm up time for the plasma head and thereby minimizes the process cycle time and eliminates the wasted gas associated with non-production use of the gas to warm up and maintain the equilibrium temperature of the plasma head. The plasma head temperature is kept at a set-point and thereby process temperature consistency is achieved. The plasma head outer temperature is within prescribed safety limits. An optimum outer surface plasma head temperature is maintained independent of the plasma ON/OFF status or plasma power settings. The plasma head outer body temperature is maintained close to the set-point within one degree accuracy.

The details of one or more embodiments of the invention are set forth in the accompanying drawings and description below. Other features, objects and advantages of the invention will be apparent from the following description of the preferred embodiments, the drawings and from the claims.

BRIEF DESCRIPTION OF THE DRAWINGS

Referring to the figures, wherein like numerals represent like parts throughout the several views.

DETAILED DESCRIPTION OF THE INVENTION

The present invention relates to a system and method for a plasma head thermal control and in particular to thermal control of a room-ambient plasma source head.

Figure 1:
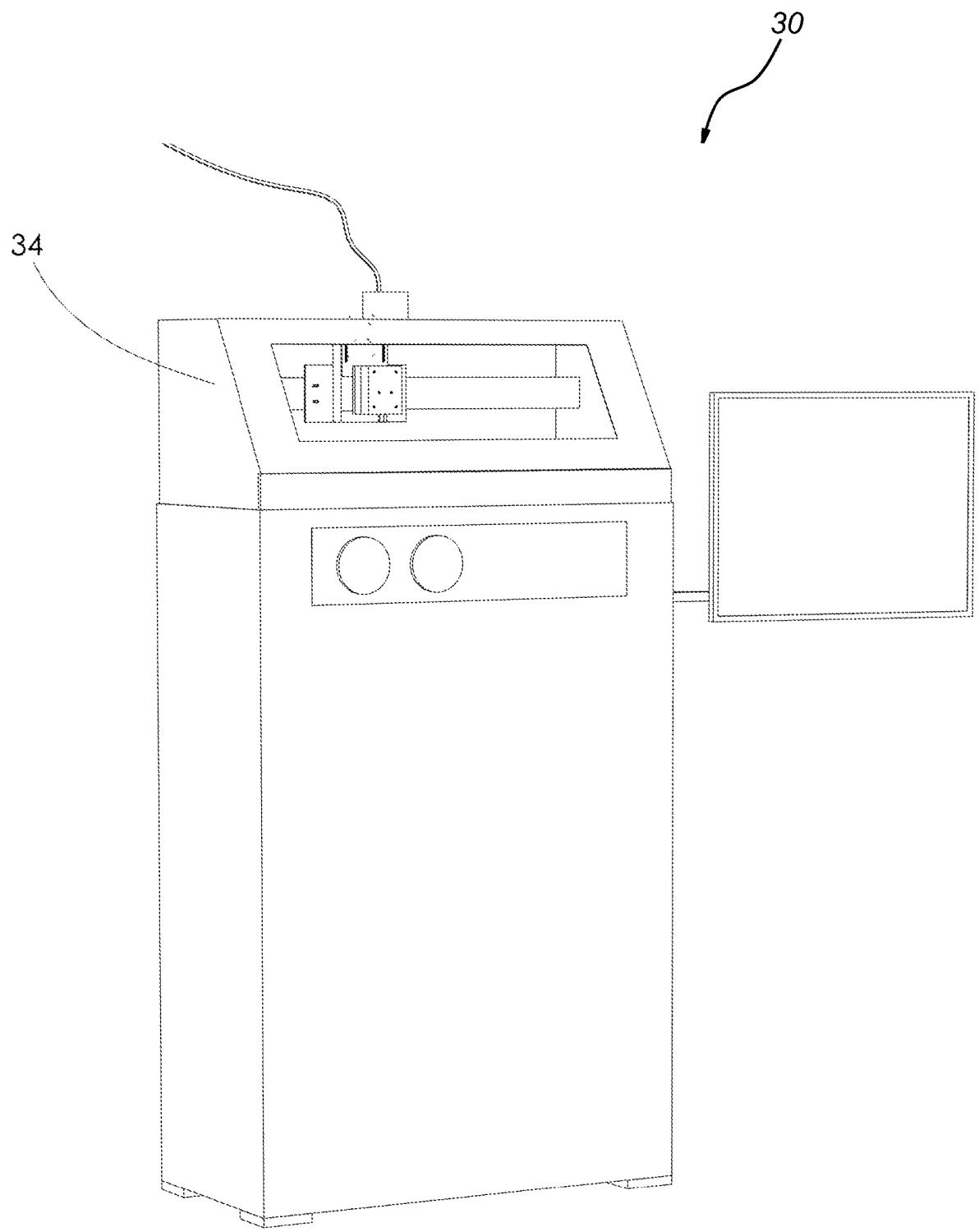
FIG. 1 depicts an example of an atmospheric pressure plasma system.
Figure 2:
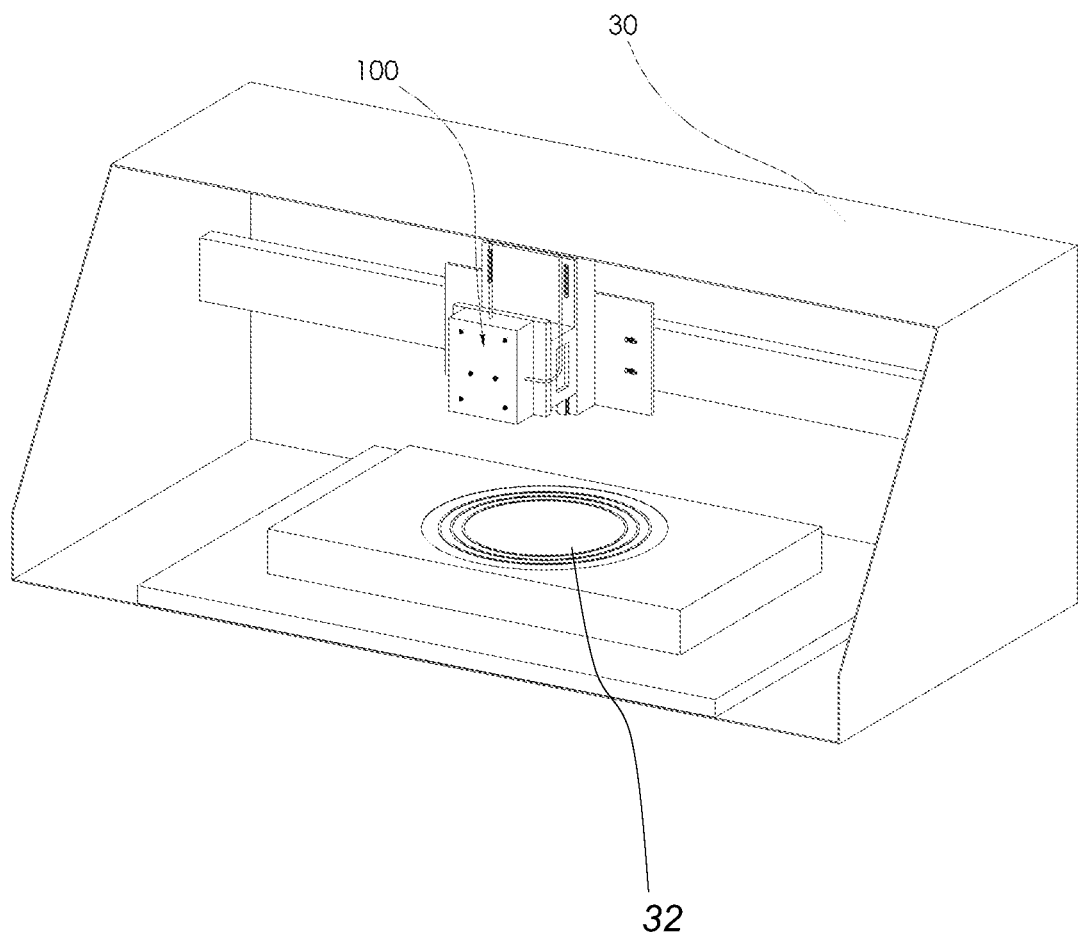
FIG. 2 depicts the plasma head and the substrate holder in the atmospheric pressure plasma system of FIG. 1.
Figure 3:
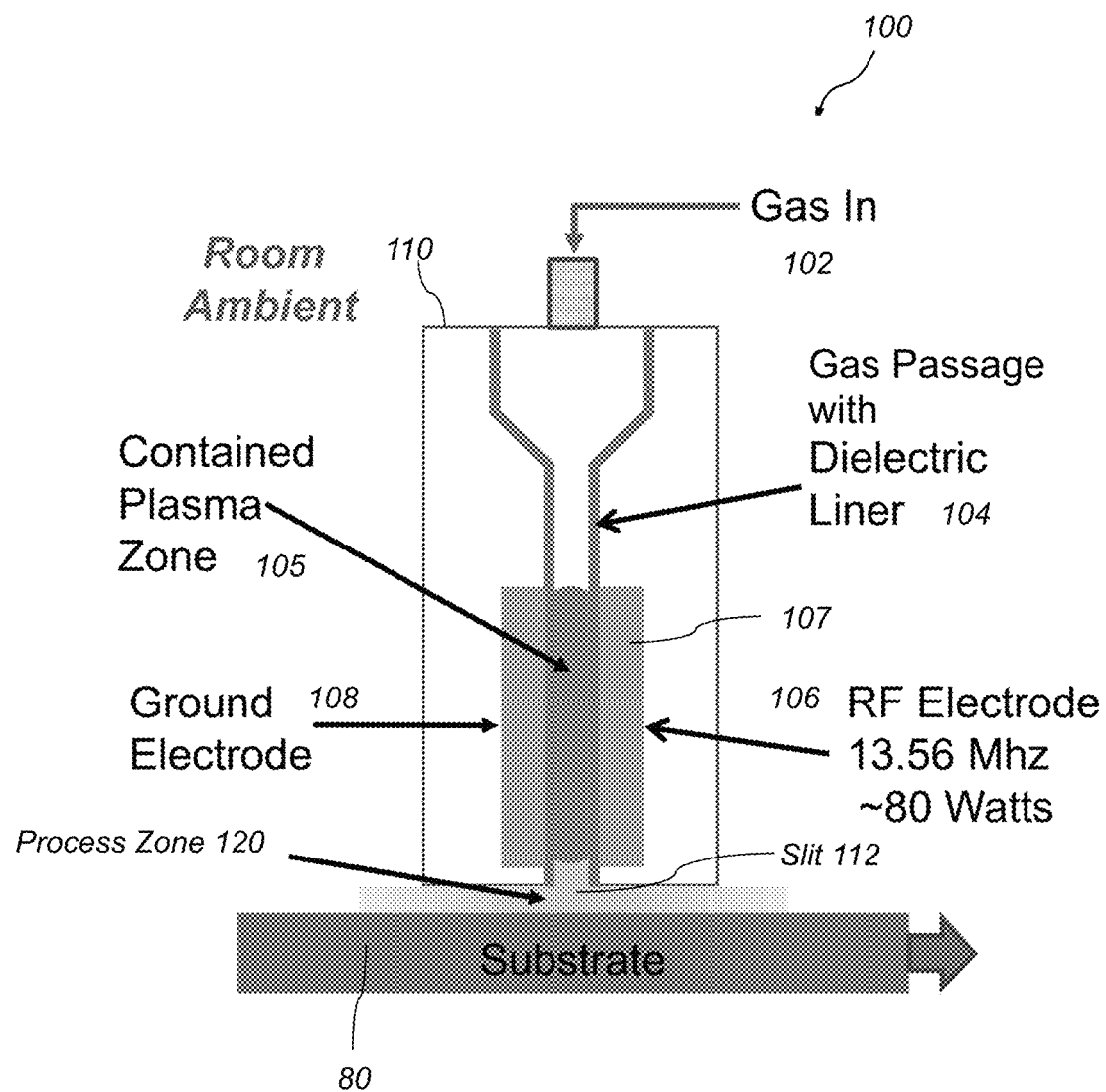
FIG. 3 is a schematic diagram of the plasma head of the atmospheric pressure plasma system of FIG. 1.
Figure 4:
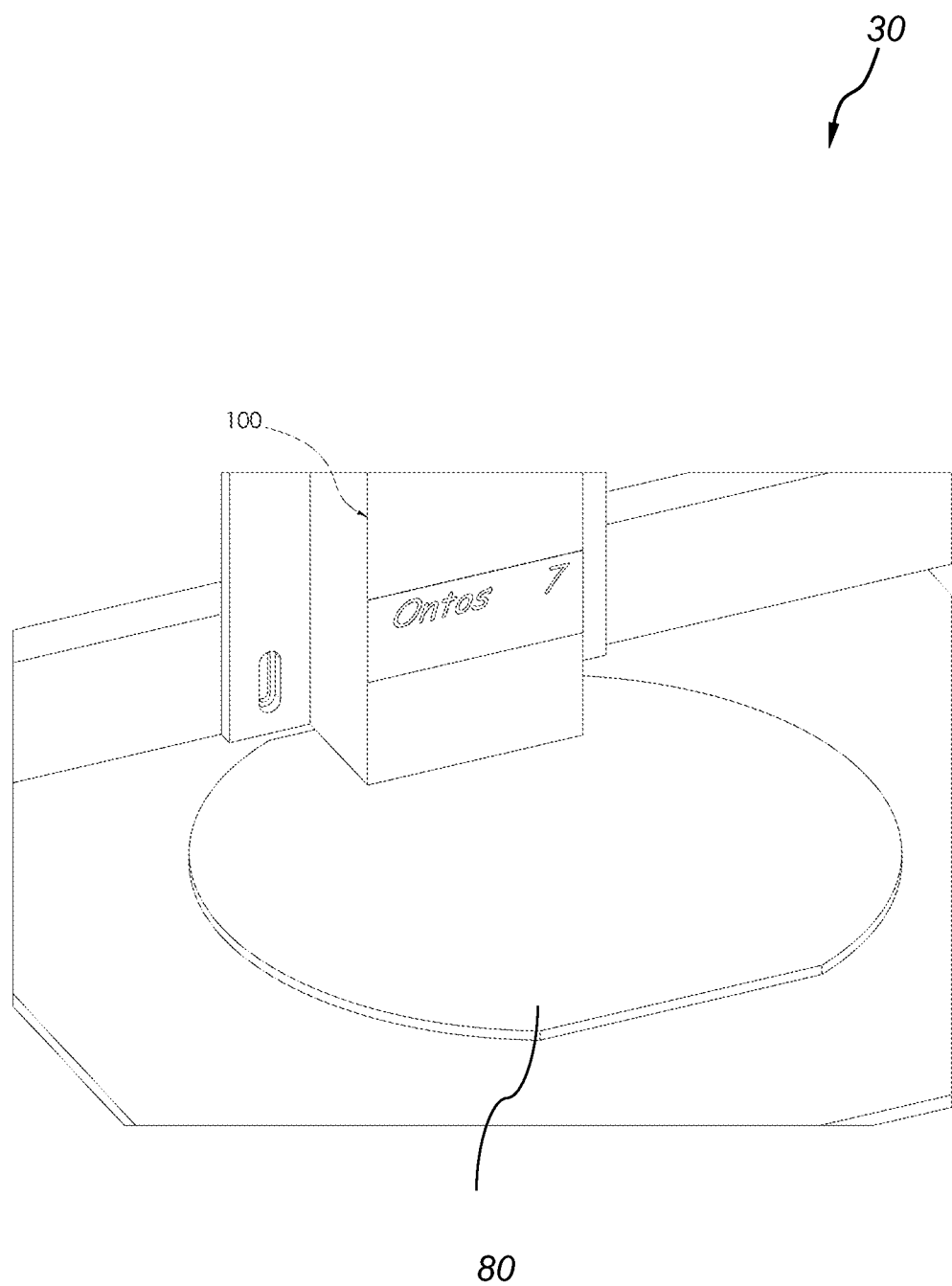
FIG. 4 depicts the plasma head of the atmospheric pressure plasma system of FIG. 1 activating the surface of a wafer 80.
Figure 5:
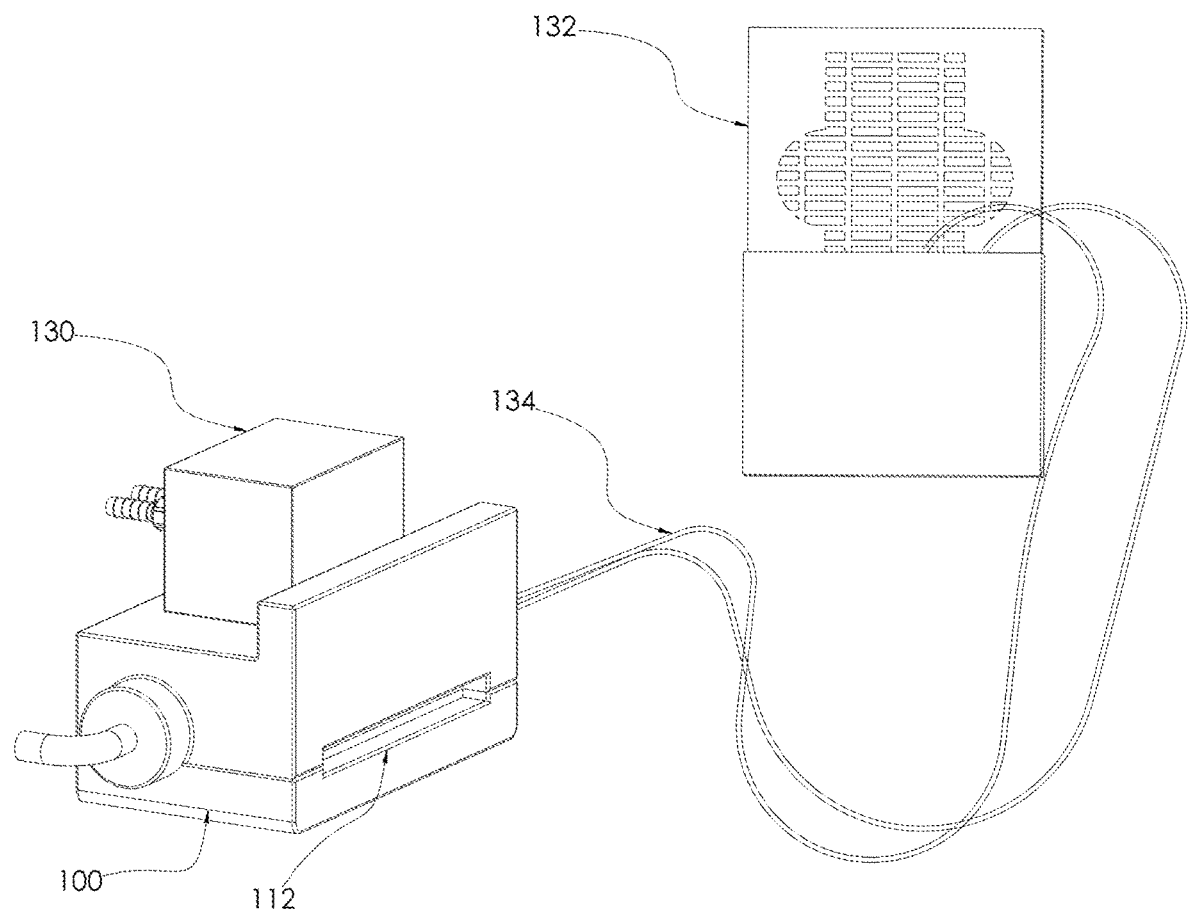
FIG. 5 depicts the plasma head of atmospheric pressure plasma system of FIG. 1 with a liquid cooling system.
Figure 6:
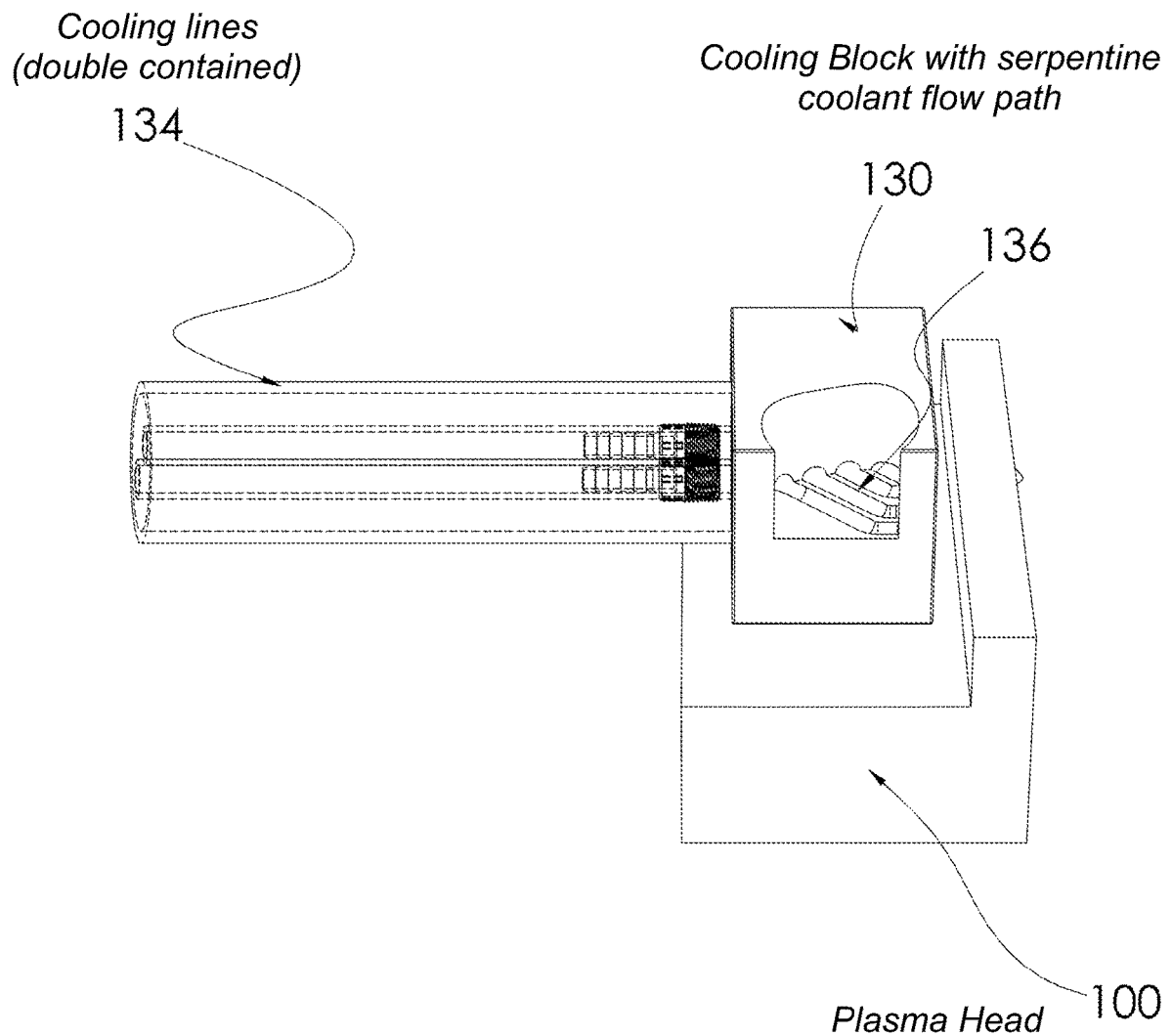
FIG. 6 depicts the plasma head of atmospheric pressure plasma system of FIG. 1 with a liquid cooling block.

Referring to FIG. 1, FIG. 2, and FIG. 3, an atmospheric pressure plasma system 30 according to this invention includes a uniquely designed atmospheric plasma source 100 with a 25 mm-wide process zone 32. Substrates with diameters from 2 mm up to 200 mm are supported on a computer controlled X-Y-Z stage. The plasma source 100 ignites a plasma at specific local areas or the whole surface of the substrate. An example of an atmospheric pressure plasma system for surface preparation is the Ontos 7, manufactured by Setna Corporation LLC, Chester, N.H. 03036, USA, incorporated herein by reference.

Referring to FIG. 3, the atmospheric plasma source 100 of plasma system 30 includes a gas inlet 102, a gas passage with a dielectric liner 104, an RF electrode 106, and a ground electrode 108. RF electrode 106 and ground electrode 108 are arranged at opposite sides of a segment 107 of the gas passage 104. Gas enters the passage with the dielectric liner 104 through inlet 102 and passes through segment 107. Between the two electrodes 106, 108 in segment 107, a glow discharge-type plasma is generated via alternating voltage. The plasma is completely contained within the source head 100. The plasma exits the gas passage via a slit 112 and enters a process zone area 120 immediately above the substrate 80. Laminar flow of the plasma gas in the process zone 120 excludes the atmosphere from the process zone 120 and thus vacuum is not needed. The activated plasma gas in the process zone 120 is a cool gas with a temperature lower than 100° C. and does not include ions or hot electrons. The electrodes are driven via RF power of 120 W at 13.56 MHz. Four mass flow channels deliver precise digital control of a non-toxic gas mix to the plasma head. Examples of gases used include Helium, Nitrogen, Oxygen, forming gas, among others. A safe interlocked enclosure 34 with safety interrupts surrounds the plasma head. In one example, the plasma output slit 112 has a length from 10 mm to 40 mm.

The temperature of the plasma gas exiting the plasma head 100 is usually around 120° C. This results in having a hot outer surface of the plasma head. Safety specifications require the temperature of the outer surface of the plasma head to be less than 60° C. A cooling block 130 provides a liquid coolant to the outer surface of the plasma head 100 in order to maintain a temperature of less than 60° C. A liquid cooling radiator and pump 132 supply the liquid coolant to the cooling block 130 via cooling lines 134. The cooling block 130 includes a serpentine coolant flow path 136. Examples of liquid coolants include water, ethylene glycol, among others. The liquid coolant does not control the plasma head temperature to a set-point, but rather an equilibrium operating temperature range is set. In one example the operating temperature range is between 30° C. to 50° C., depending upon the selected plasma RF power level. The process time for reaching this plasma head temperature equilibrium is 10 to 15 minutes long. This unused plasma warm-up time is costly, especially for small substrates, where the actual process time is significantly less than the warm-up time. The wasted plasma warm-up time reduces the process throughput, wastes process gas and wastes energy. Especially, in some production environments, the plasma runs continuously in order to keep the process gas hot and to maintain a stable plasma head temperature.

Figure 7:
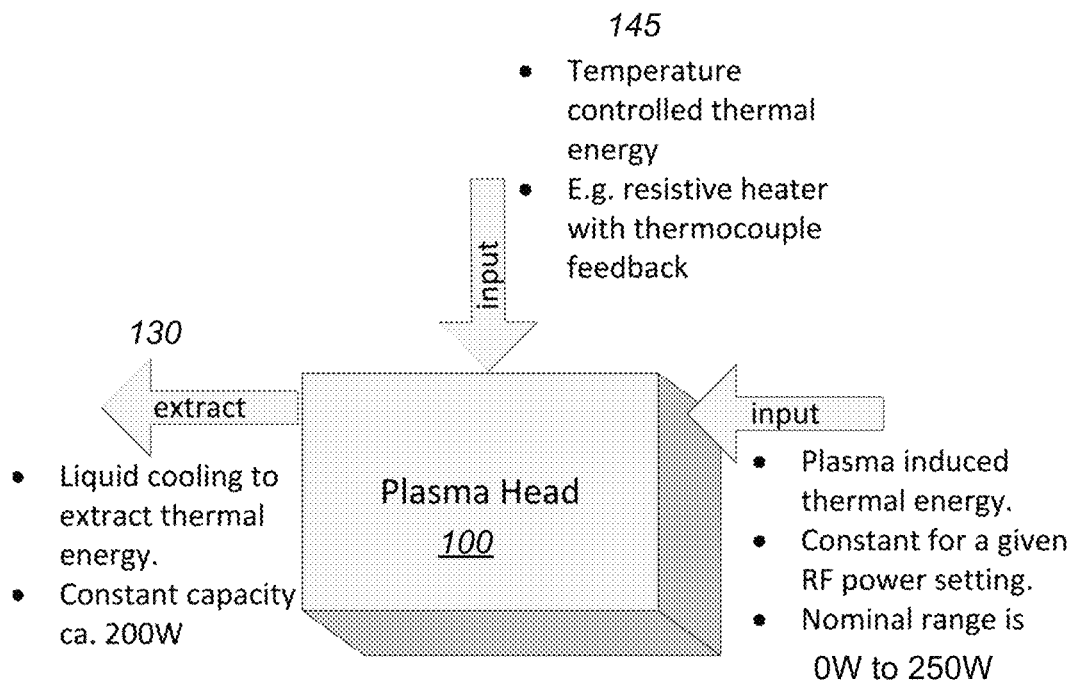
FIG. 7 is a schematic diagram depicting the combination of a liquid cooling system with a thermally controlled heating system for providing controlled thermal energy to the plasma head of the atmospheric pressure plasma system of FIG. 1.
Figure 8:
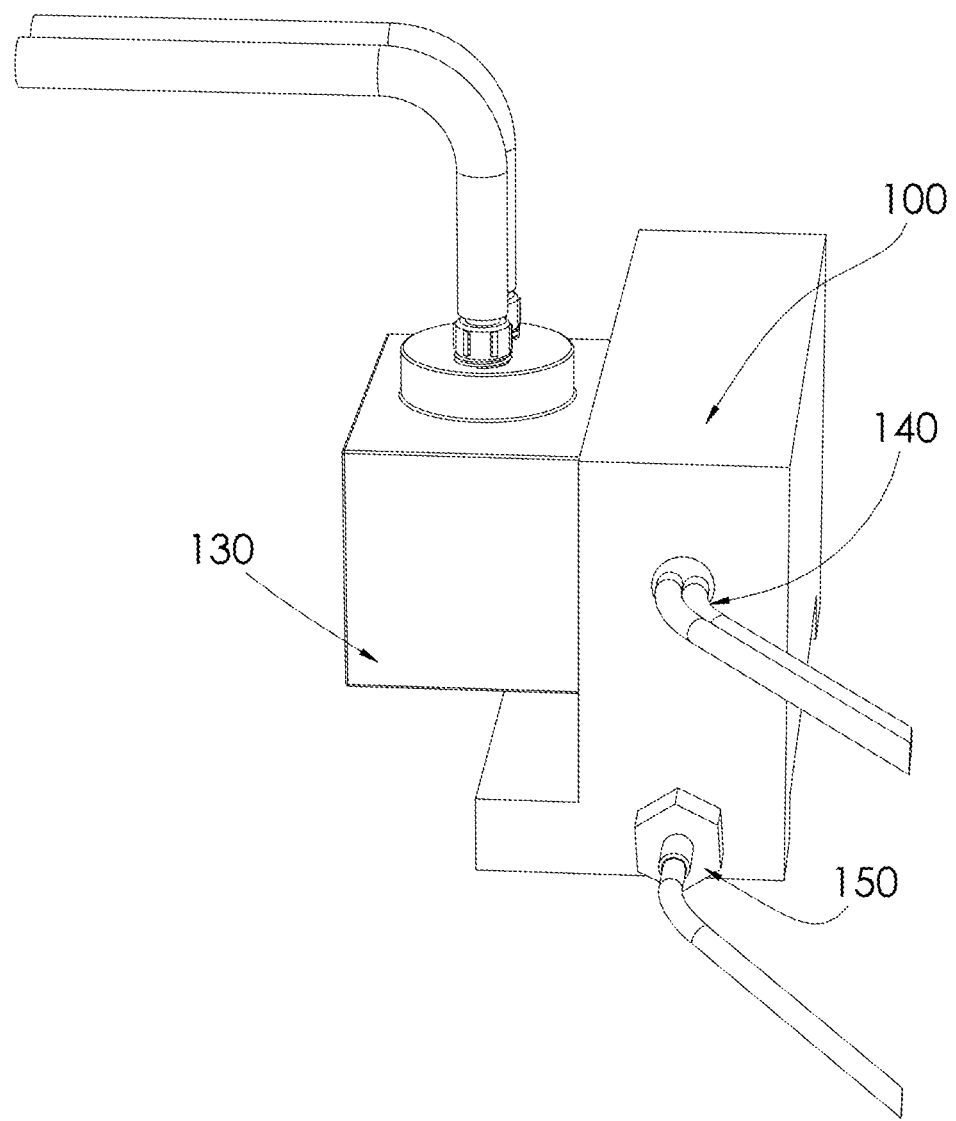
FIG. 8 depicts the plasma head of the atmospheric pressure plasma system of FIG. 1 with an imbedded resistive heater and temperature sensor and a liquid cooling block.

In order to overcome these issues related to the plasma warm-up phase, a temperature controlled resistive heater is added to the plasma head. Referring to FIG. 7 and FIG. 8, a resistive heater 140 is embedded in the outer surface of the plasma head 110 or in the plasma head body and together with a temperature sensor 150, they provide temperature controlled thermal energy 145 to the outer surface of the plasma head. In one example, the temperature sensor 150 is a thermocouple and the thermal energy is controlled via a programmable temperature controller. The combination of the liquid cooling block 130 with the resistive heater 140 provides controlled thermal energy to the plasma head in order to maintain an outer surface plasma head temperature at a point above the plasma-on equilibrium temperature and below the safety limit of 60° C. This optimum outer surface plasma head temperature is maintained independent of the plasma ON/OFF status or plasma power settings.

Figure 9:
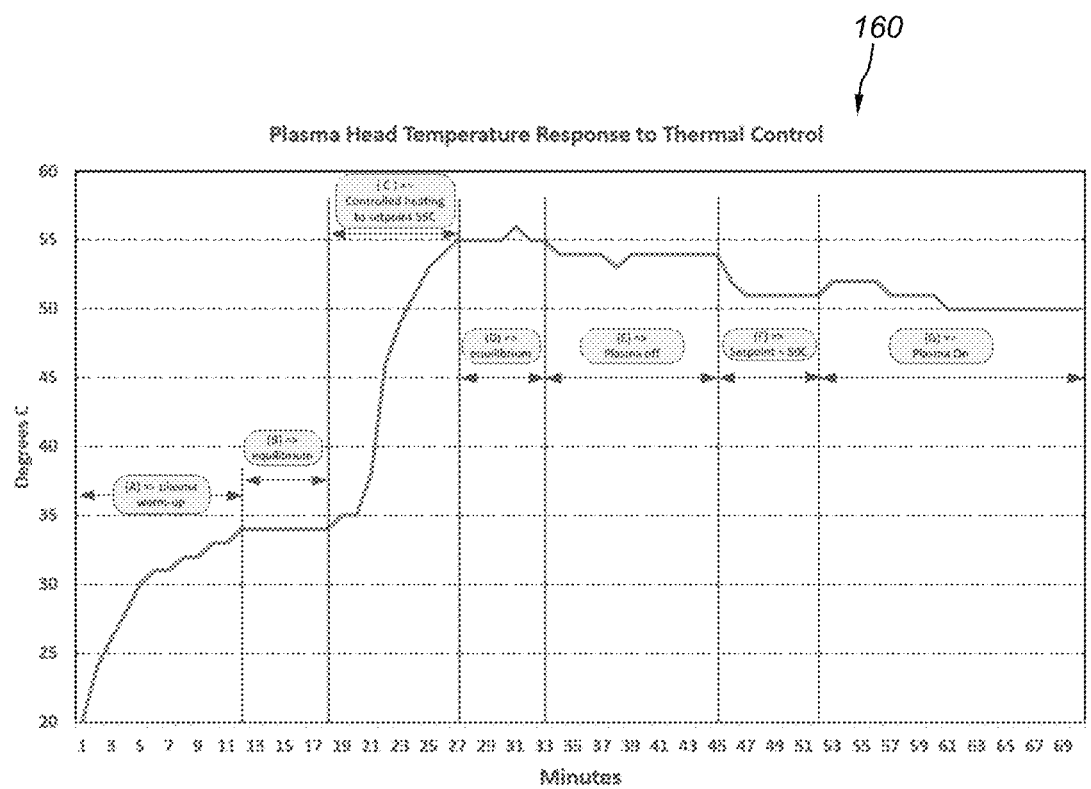
FIG. 9 depicts a graph of the plasma head outer surface temperature as a function of time for the plasma head of FIG. 8.

Referring to FIG. 9, the effect of the thermal control of FIG. 8 on the temperature of the outer surface of the plasma head during the various stages of the plasma processing includes the following. Initially, during the plasma warm-up period A, the plasma RF power is about 80 W and in about 12 minutes, the outer plasma head temperature increases and reaches equilibrium between 30° C. and 40° C. in period B. In one example, the period B temperature is 34° C. In the next period C, the plasma power continues to be ON and controlled heating is initiated to reach an outer plasma head temperature of 55° C. During this period C, active cooling is also ON. The ramp-up time is 9 minutes and the set temperature is reached in about 6 minutes. During period D, the plasma power is ON, controlled heating is ON and active cooling is ON, and the temperature remains stable at 55° C. In the next period E, the plasma power is turned OFF, controlled heating is ON and active cooling is ON, and the temperature remains stable at 54° C., while the set point is 55° C. In the next period F, the plasma power is OFF, controlled heating is ON and active cooling is ON, and the temperature is steady at 51° C., while the set point was programmed to be 50° C. In period G, the plasma power is turned ON, controlled heating is ON and active cooling is ON, and the temperature is steady at 50° C., while the set point was programmed to be 50° C. The graph of FIG. 9 indicates that the combination of the controlled heating 140 with the liquid cooling 130 maintains the plasma head outer body temperature close to the set-point within one degree accuracy, independent of the plasma power ON or OFF status.

In other embodiments, controlled heating is provided via a halogen lamp radiant heat, and laminated thermoresistive wafers.

Several embodiments of the present invention have been described. Nevertheless, it will be understood that various modifications may be made without departing from the spirit and scope of the invention. Accordingly, other embodiments are within the scope of the following claims.

What is claimed is:

1. An atmospheric pressure plasma system comprising:
an atmospheric pressure gas plasma source that generates a glow discharge-type plasma;
wherein the atmospheric pressure gas plasma source comprises a plasma head, a heating element and an active cooling element and the heating element and active cooling element control the plasma head temperature to a set-point temperature independent of variations in plasma generating power or plasma power ON/OFF status; and
wherein the plasma head comprises a gas inlet, a gas passage surrounded by a dielectric liner, a radio frequency (RF) electrode and a ground electrode and wherein the RF electrode and the ground electrode are arranged at opposite sides of an outer surface of a segment of the gas passage.

2. The system of claim 1, wherein the active cooling element comprises a cooling block that is placed in contact with an outer surface of the plasma head and wherein the cooling block sets an equilibrium operating temperature for the outer surface of the plasma head.

3. The system of claim 2, wherein the equilibrium operating temperature for the outer surface of the plasma head is less than 60° C.

4. The system of claim 2, wherein the cooling block comprises a serpentine coolant flow path and wherein a liquid cooling radiator and a pump supply a liquid coolant to the cooling block and the liquid coolant passes through the serpentine coolant flow path.

5. The system of claim 1, wherein the atmospheric pressure gas plasma source further comprises at least one temperature sensor, and a power controller for the heating element.

6. The system of claim 5, wherein the heating element comprises a resistive heater that is embedded in an outer surface of the plasma head and wherein the resistive heater together with the temperature sensor provide a temperature controlled thermal energy to the outer surface of the plasma head.

7. The system of claim 1, wherein the glow discharge-type plasma is generated via an alternating voltage in the segment of the gas passage between the RF electrode and the ground electrode and wherein the glow discharge-type plasma is completely contained within the plasma head.

8. The system of claim 1, further comprising a process zone area that supports a substrate.

9. The system of claim 8, wherein the plasma head further comprises a slit and the glow discharge-type plasma exits via the slit and enters the process zone area immediately above the substrate.

10. The system of claim 8, wherein the glow discharge-type plasma comprises a temperature lower than 100° C. in the process zone area immediately above the substrate.

11. The system of claim 9, wherein the slit is dimensioned to generate a laminar flow of the glow discharge-type plasma in the process zone area immediately above the substrate and the laminar flow of the glow discharge-type plasma excludes atmospheric air in the process zone above the substrate.

12. A method of generating an atmospheric pressure plasma comprising:
providing an atmospheric pressure gas plasma source that generates a glow discharge-type plasma, wherein the atmospheric pressure gas plasma source comprises a plasma head, a heating element and an active cooling element;
activating simultaneously the heating element and the active cooling element to control the plasma head temperature to a set-point temperature independent of variations in plasma generating power or plasma power ON/OFF status; and
wherein the plasma head comprises a gas inlet, a gas passage surrounded by a dielectric liner, a radio frequency (RF) electrode and a ground electrode and wherein the RF electrode and the ground electrode are arranged at opposite sides of an outer surface of a segment of the gas passage.

13. The method of claim 12, wherein the active cooling element comprises a cooling block that is placed in contact with an outer surface of the plasma head and wherein the cooling block sets an equilibrium operating temperature for the outer surface of the plasma head.

14. The method of claim 13, wherein the equilibrium operating temperature for the outer surface of the plasma head is less than 60° C.

15. The method of claim 13, wherein the cooling block comprises a serpentine coolant flow path and wherein a liquid cooling radiator and a pump supply a liquid coolant to the cooling block and the liquid coolant passes through the serpentine coolant flow path.

16. The method of claim 12, wherein the atmospheric pressure gas plasma source further comprises at least one temperature sensor, and a power controller for the heating element.

17. The method of claim 16, wherein the heating element comprises a resistive heater that is embedded in an outer surface of the plasma head and wherein the resistive heater together with the temperature sensor provide a temperature controlled thermal energy to the outer surface of the plasma head.

18. The method of claim 12, wherein the glow discharge-type plasma is generated via an alternating voltage in the segment of the gas passage between the RF electrode and the ground electrode and wherein the glow discharge-type plasma is completely contained within the plasma head.

19. The method of claim 12, wherein the plasma head further comprises a slit and the glow discharge-type plasma exits via the slit and enters a process zone area immediately above a substrate.

20. The method of claim 19, wherein the slit is dimensioned to generate a laminar flow of the glow discharge-type plasma in the process zone area immediately above the substrate and the laminar flow of the glow discharge-type plasma excludes atmospheric air in the process zone above the substrate.

* * * * *